United States Patent [19]

Schilling et al.

[11] Patent Number: 4,584,627
[45] Date of Patent: Apr. 22, 1986

[54] FLAT DECOUPLING CAPACITOR AND METHOD OF MANUFACTURE THEREOF

[75] Inventors: Donald P. Schilling, Albuquerque, N. Mex.; Raymond C. Jodoin, Scottsdale; Joseph E. Johnston, Chandler, both of Ariz.

[73] Assignee: Rogers Corporation, Rogers, Conn.

[21] Appl. No.: 690,117

[22] Filed: Jan. 9, 1985

[51] Int. Cl.[4] .................. H01G 9/05; H01G 7/00; H05K 5/00

[52] U.S. Cl. .................... 361/306; 29/25.42; 174/52 FP

[58] Field of Search .......... 361/400, 402, 404, 328; 174/52 FP; 29/25.42; 361/306, 308, 309, 310, 321 C, 433 C, 433 S

[56] References Cited

U.S. PATENT DOCUMENTS

| | | | |
|---|---|---|---|
| 3,590,348 | 6/1971 | Bertics | 361/308 |
| 3,665,256 | 5/1972 | Goun et al. | 361/400 X |
| 4,038,488 | 7/1977 | Lin | 174/52 FP |
| 4,497,012 | 1/1985 | Gottlieb et al. | 29/25.42 X |
| 4,514,750 | 4/1985 | Adams | 174/52 FP X |
| 4,516,186 | 5/1985 | Hardy et al. | 361/400 X |

*Primary Examiner*—Donald Griffin
*Attorney, Agent, or Firm*—Fishman & Dionne

[57] ABSTRACT

A flat decoupling capacitor having incorporated therein a multilayer chip capacitor which provides high capacitance values, local charge storage and noise decoupling for integrated circuits is presented. The decoupling capacitor essentially comprises at least two conductors electrically connected to a multilayer ceramic capacitor chip, all of which are encapsulated by an insulating material. Several embodiments are described having variations in chip dimensions, number of multilayer capacitors, number of conductors and particular structural configuration. A simplified embodiment and method of manufacture thereof is also presented.

23 Claims, 17 Drawing Figures

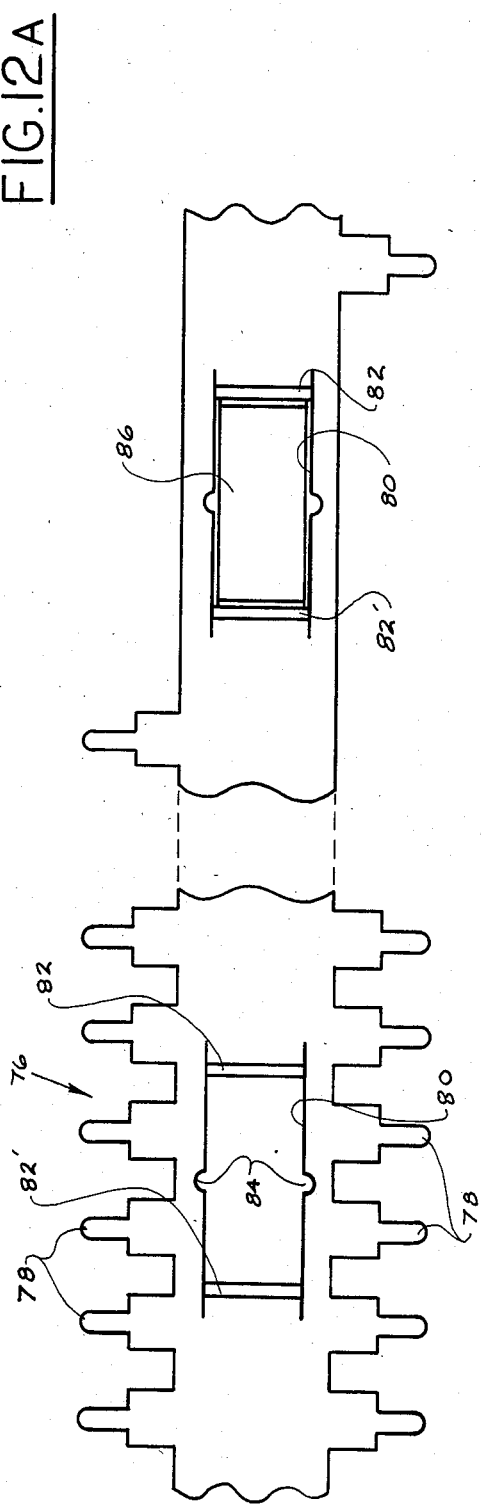
FIG.11A
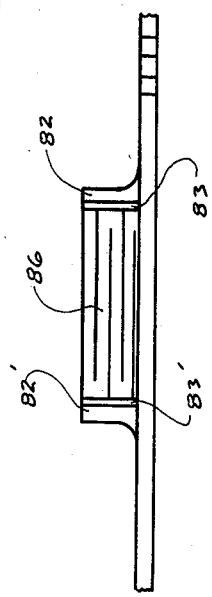
FIG.12A
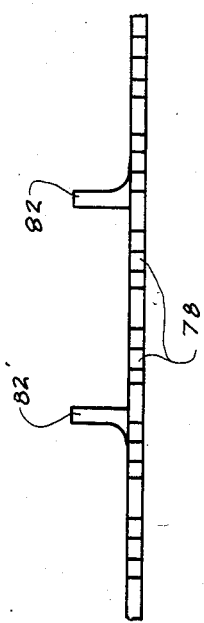
FIG.12B
FIG.11B

FLAT DECOUPLING CAPACITOR AND METHOD OF MANUFACTURE THEREOF

BACKGROUND OF THE INVENTION

This invention relates to the field of decoupling capacitors for integrated circuits. More particularly, this invention relates to a novel flat decoupling capacitor and a method of formation thereof which incorporates therein a multilayer chip capacitor whereby higher capacitance values are provided for integrated circuits.

Decoupling capacitors are utilized extensively in printed circuit boards for use in conjunction with dual-in-line integrated circuits or other electronic components. Prior art decoupling capacitors are described in prior U.S. patent application Ser. Nos. 403,408 and 456,654 which are assigned to the assignee hereof and incorporated herein by reference thereto.

Unfortunately, the types of decoupling capacitors disclosed in the above patent applications are limited to specific capacitance values. These values depend upon the number of individual planar ceramic capacitor chips which the decoupling capacitor is able to hold therein. Often, these limited and specific values do not meet the requirements of purchasers and manufacturers. In fact, manufacturers of electronic equipment and the like have required higher capacitance levels than can be achieved by utilizing standard planar chips. The need for higher capacitance values is particularly important for the smaller integrated circuit packages wherein only relatively low (i.e., 0.02 microfarads) capacitance levels are currently available.

It has been determined that the problem concerning limited capacitance values in decoupling capacitors cannot be overcome simply by modifying existing capacitors without great expense and substantial changes. In fact, using current technology, a conventional planar capacitor cannot be modified to attain higher capacitance without major changes in the manufacturing process. Furthermore, even with these substantial modifications, at most, only a doubling or tripling of the nominal capacitance is probably the best one skilled in the art could hope to attain.

SUMMARY OF THE INVENTION

The above discussed and other problems of the prior art are overcome or substantially reduced by the novel flat decoupling capacitor of the present invention. In accordance with the present invention, a flat decoupling capacitor has incorporated therein a multilayer chip capacitor which provides high desired capacitance values, local charge storage and noise decoupling for integrated circuits. The novel structure of the present invention is dimensioned such that it consumes no more space on the printed circuit board than is already allocated to the conventional integrated circuits. Moreover, the decoupling capacitor of the present invention has low series inductance and resistance for excellent noise suppression characteristics.

The flat decoupling capacitor of the present invention has three essential elements including the multilayer ceramic capacitor chip, the conductor(s) and the encapsulation. Preferably, the multilayer capacitor is of the commercially available type utilizing interleaved layers of ceramic and metallization fired to form a monolithic block. The conductors are flat metal plates incorporating tangs or tabs at a 90° angle to the plane of the conductors and a tab, pin or beam lead as an interconnect to the integrated circuit. The tangs or tabs are the bonding surfaces to which the electrodes of the chip capacitor are connected. The conductor may also incorporate a shelf upon which the chip capacitor rests. The encapsulation may be a molded, dipped, cast or laminated covering to exclude moisture and insulate the conductors from the printed circuit board.

The decoupling capacitor of the present invention fits under an integrated circuit and is connected to the power and ground leads of the IC by the shortest possible means. In the case of dual in-line packages, the decoupling capacitor has power and ground pins which share plated through holes with the power and ground pins of the IC. Alternatively, separate through-holes may be provided in the circuit board with a circuit trace or other suitable means electrically connecting the power and ground pins of the IC with the capacitor pins. In the case of surface mounted IC's, the decoupling capacitor has tabs or leads which are connected with the power and ground tabs or leads of the IC, or to the voltage and gound planes.

A number of preferred embodiments are described hereinafter having variations in, for example, multilayer capacitor chip dimensions, number of multilayer chips, number of conductors, and the geometry of the configuration of particular structural elements. One preferred embodiment, a simplified version of the present invention and a method of making the same, is provided which greatly decreases the cost and complication of manufacturing.

The decoupling capacitors of the present invention offer many advantages and features over prior art, conventional devices, including, but not limited to, much higher capacitance values than are attainable using planar ceramic capacitors. Other features include lower production costs due to the use of commercially available multilayer chip capacitors and inexpensive assembly, more simplified design of the decoupling loop, reduced EMI/RFI through field containment and reduced antenna area, reduced inductance which cuts the induced voltage spikes when integrated circuits switch, and under-the-IC mounting which allows more efficient use of printed circuit board space.

The above discussed and other advantages of the present invention will be apparent to and understood by those skilled in the art from the following detailed description and drawings.

BRIEF DESCRIPTION OF THE DRAWINGS

Referring now to the FIGURES of the drawings, wherein like elements are numbered alike in the several FIGURES:

FIG. 11A is a planar view of a first stage of subassembly components and construction of the decoupling capacitor in accordance with the present invention.

FIG. 11B is a front elevation view of the subassembly of FIG. 11A.

FIG. 12A is a planar view of a second stage of subassembly components and construction of the decoupling capacitor of the present invention.

FIG. 12B is a front elevation view of the subassembly of FIG. 12A.

DESCRIPTION OF THE PREFERRED EMBODIMENTS

Figure 1:
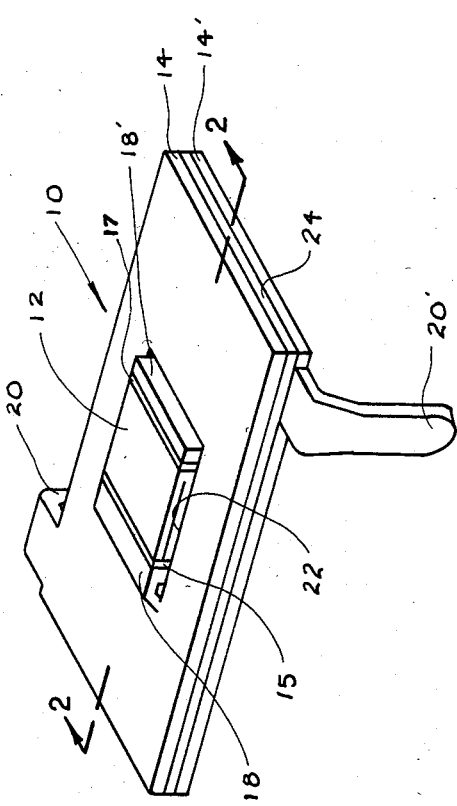
FIG. 1 is a perspective view of a flat decoupling capacitor, without encapsulation, in accordance with the present invention.
Figure 3:
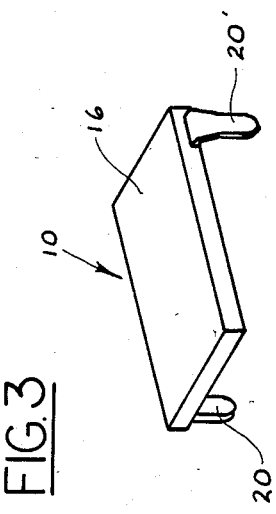
FIG. 3 is a perspective view of the decoupling capacitor of FIG. 1 provided with encapsulation.
Figure 2:
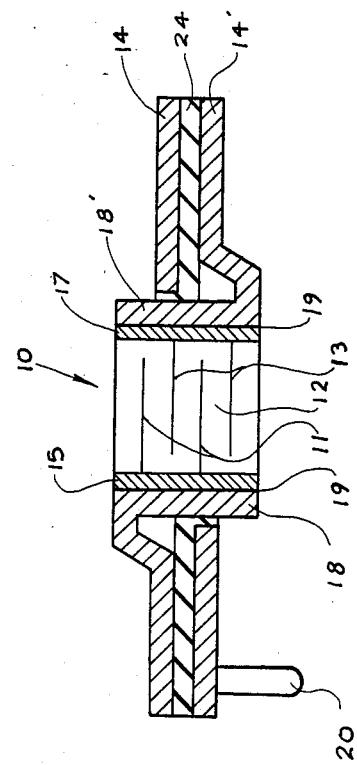
FIG. 2 is a cross-sectional elevation view along line 202 of FIG. 1 of the decoupling capacitor of FIG. 1 provided with encapsulation.

Referring first to FIGS. 1-3, the flat decoupling capacitor of the present invention is shown generally at 10. The capacitor 10 is designed to fit under an integrated circuit package and be connected to the power and ground interconnects of the integrated circuit by the shortest possible means. When utilized in conjunction with dual-in-line integrated circuits, the capacitor of the present invention is provided with power and ground pins which share plated through-holes with those of the integrated circuits or alternatively are provided with separate through-holes if outboard mounting is desired. When the present invention is used as a surface mounted component, it has pins or leads which mate with the power and ground pins or leads of the integrated circuit.

In FIGS. 1-3, a typical capacitor assembly in accordance with the present invention is shown. The capacitor 10 has three distinct structural elements including the (1) multilayer ceramic capacitor chip 12, (2) conductors 14 and 14' and (3) encapsulation 16. The multilayer capacitor 12 is of the commercially available type utilizing interleaved layers of ceramic and metallization, with alternate layers of metal 11 and 13 connected to end plate electrodes 15 and 17, respectively, fired to form a monolithic block. The conductors 14 and 14' are flat metal plates incorporating tangs or tabs 18 and 18' at a 90 degree angle to the plane of the conductors 14, 14' and pins 20 and 20' which act as an interconnect to the integrated circuit. The tangs or tabs 18, 18' are the bonding surfaces to which the electrodes 15 and 17 of the chip capacitor 12 are connected.

In FIGS. 1-3, the end electrodes 15 and 17 of multilayer chip 12 are bonded to the tabs 18,18', of the two conductors 14 and 14' by adhesive 19 to effect electrical and mechanical connection. The adhesive is, preferably, a nonconductive adhesive, with electrical contact being effected by differential surface roughness in accordance with U.S. Pat. No. 4,236,038 (assigned to the assignee hereof and incorporated herein by reference). Alternatively, conductive adhesive or solder may be used.

Each conductor 14,14' has a single tang or tab 18 or 18' and a central clearance window 22 to receive the chip 12 and into which the tabs 18 project. This structural arrangement permits the chip 12 to be isolated from the conductors 14, 14' (except where bonded to the tangs 18, 18') upon insertion therein. The conductors 14, 14' are separated by an insulation layer 24. The width of this insulation layer 24 should be kept to a minimum to keep the conductors 14, 14' in close proximity and thereby minimize inductance.

Preferably, the assembly as shown in FIG. 1 is provided with an insulating encapsulation 16 as shown in FIG. 3. This encapsulation 16 may be a molded, dipped, cast, laminated or any other suitable covering which will effectively exclude moisture and insulate the conductors from the printed circuit board on which the decoupling capacitor is to be mounted. Note that insulating layer 24 may be an integral or separate part of the encapsulation 16.

Upper conductor 14 is connected to end electrode 15 by tang 18, and lower conductor 14' is connected to electrode 17 by tang 18'. Thus pins 20 and 20' are connected to opposite end electrodes of the multilayer capacitor.

Figure 4:
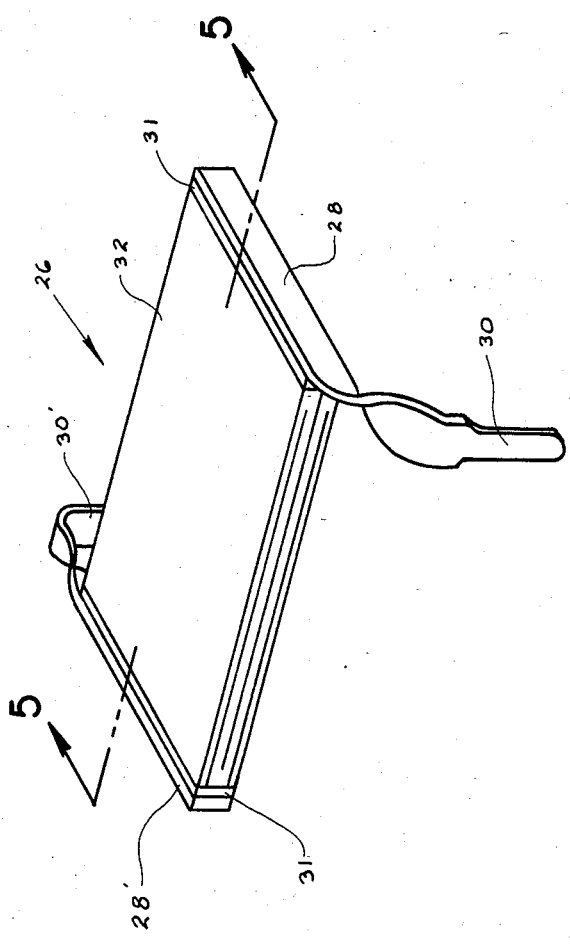
FIG. 4 is a perspective view of another embodiment of the decoupling capacitor of FIG. 1 and in accordance with the present invention.
Figure 5:
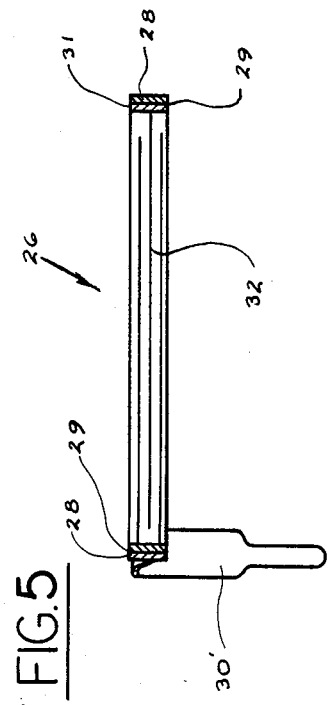
FIG. 5 is a cross-sectional elevation view along line 505 of FIG. 4 of the decoupling capacitor of FIG. 4.

Referring now to FIGS. 4 and 5, an alternative embodiment of the decoupling capacitor of the present invention is shown at 26. This embodiment principally differs from that shown in FIGS. 1-3 in the length of the multilayer connector and in the configurations of the conductors. Thus, unlike the flat planar conductors 14, 14' described previously, the capacitor chip 32 is of a length such that conductors between the chip and the connecting pins are not required; and the conductors 28, 28' of capacitor 26 are merely short extensions of the pins 30, 30'. The pins 30,30' extend from the conductors 28,28' by 90° twisted sections, with the conductors 28,28' being bonded by adhesive 29 directly to the electrodes 31,31' of the multilayer chip 32. Finally, the assembly as shown in FIG. 4 may similarly be provided with an encapsulation (not shown) as in the previous FIGURES. This particular embodiment of the present invention will allow versatility by permitting a thinner assembly, variably sized chip 32 and less conductive material relative to the previously discussed embodiment.

Figure 6:
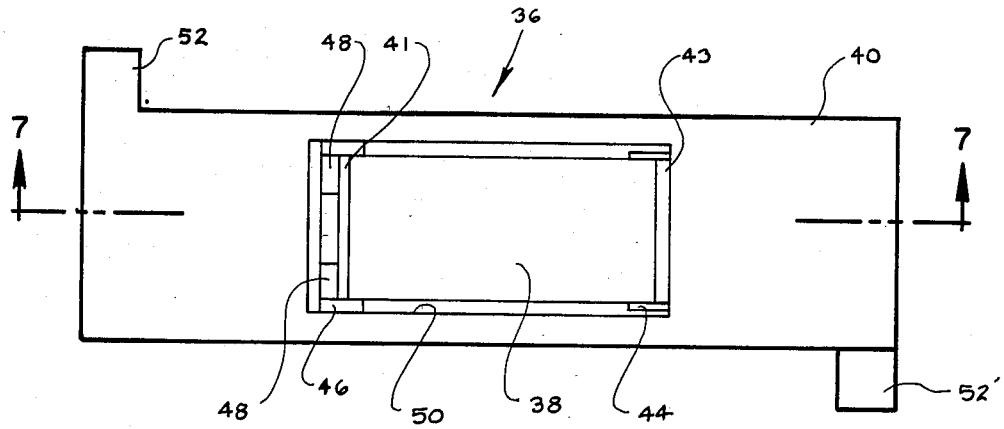
FIG. 6 is a planar view of another embodiment of the decoupling capacitor in accordance with the present invention.
Figure 7:
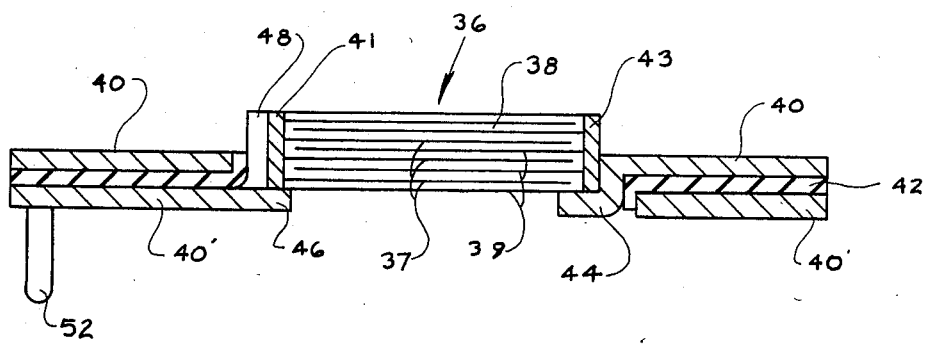
FIG. 7 is a cross-sectional elevation view along line 7—7 of FIG. 6 of the decoupling capacitor of FIG. 6.

In FIGS. 6 and 7, a "shelf" version of the decoupling capacitor of the present invention is shown generally at 36. In this embodiment, the decoupling capacitor utilizes a low profile multilayer chip capacitor 38 in order to provide improved manufacturing (i.e., greater ease and lower cost). Capacitor 38 has interlined metal layers 37 and 39 connected, respectively to opposite end plates 41 and 43. The two conductors 40, 40' are separated by an insulating layer 42 and provided with supporting shelves 44 and 46. Shelf 44 extends from the top conductor 40 therefore necessitating a curved step construction whereas shelf 46 is actually the planar extension of conductor 40'. Tangs 48 act to electrically contact chip 38 after the chip 38 has been inserted into window 50 in conductors 40,40'. Tangs 48 are bonded to electrode 41 by adhesive 51 to effect electrical connection between tangs 48 and electrode 51. Pins 52, 52' provide the contact between the capacitor 36 and an integrated circuit (not shown). As in the previous embodiment, the entire assembly may be encapsulated (not shown) for protection against moisture and for insulation purposes.

Figure 8A:
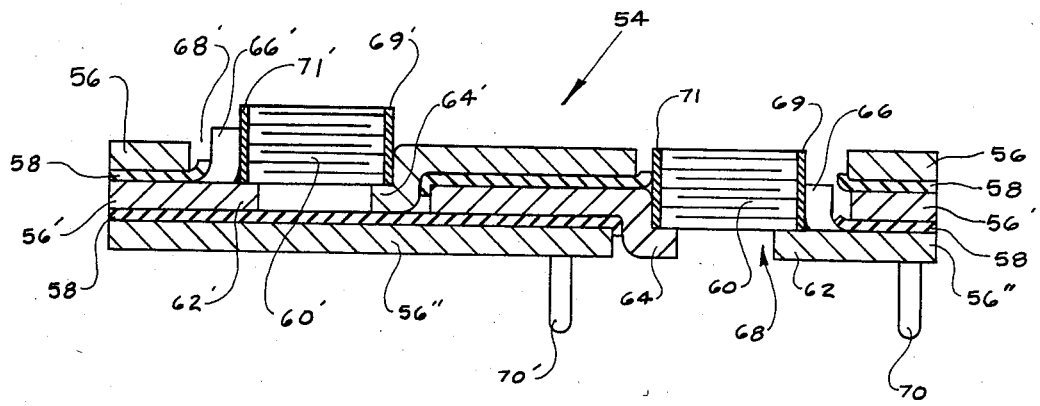
FIG. 8A is a cross-sectional elevation view (along line 8A—8A of FIG. 8B) of still another embodiment of the decoupling capacitor in accordance with the present invention.
Figure 8B:
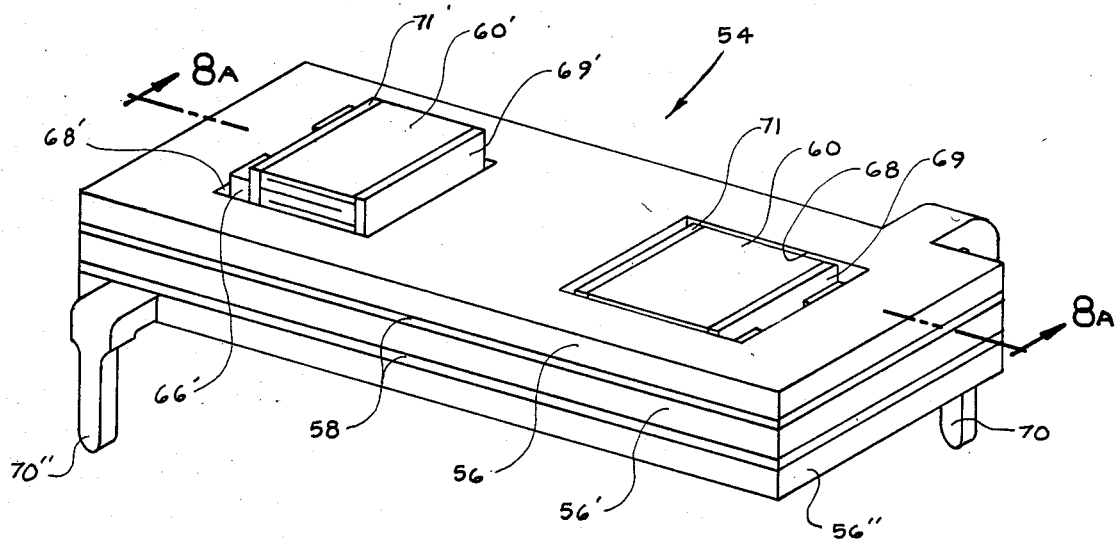
FIG. 8B is a perspective view of the decoupling capacitor of FIG. 8A.

With regard to FIGS. 8A and 8B, another alternative embodiment referred to as a "twin capacitor" version is shown at 54. This embodiment comprises three separated conductors including a top conductor 56, bottom conductor 56" and a center conductor 56. Similarly, the curbed step portion of shelf 46 is bonded (as by adhesive) to electrode 43. Thus, upper conductor 40 is connected to electrode 43 and lower conductor 40' is connected to electrode 41 sandwiched between the top and bottom conductors. All of conductors 56, 56' and 56" are separated by insulating layers 58. In this embodiment the center conductor 56' is ground while the two outer conductors 56, 56" are connected to separate power or voltage levels. The twin capacitor 54 effects electrical and mechanical contact between the multilayer chip capacitors 60 and conductors 56, 56' and 56" in a similar manner to the shelf version discussed just previously with respect to FIGS. 6 and 7. Accordingly, shelve 62 on lower conductor 56", and shelf 64 on ground conductor 56' support chip 60 in window 68, shelf 64 having a curved step construction and shelf 62 comprising a planar extension of conductor 56". Tang 66 acts to electrically connect chip 60 to conductor 56 after the chip has been inserted through window 68 and bonded to electrode 69. Central conductor 56' is connected to electrode 71 of the multilayer chip 60 through the curved or stepped portion of shelf 64. Thus, chip 60 is connected across conductors 56' and 56". Finally, pins 70 and 70', provide the connection between the capacitor chip 60 and an integrated circuit (not shown).

In a similar manner, a second multilayer chip 60' is supported on shelves 62' and 64' in window 68'. The top conductor 56 is connected to end electrode 69' of a second multilayer chip 60', and central conductor 56' is connected to electrode 71' by a tang 66'. Thus, chip 60' is connected across conductors 56 and 56'. In the embodiment of FIGS. 8A, 8B of the present invention, there will be a total of at least three pins or leads 70,70',70". This embodiment is commonly used with an integrated circuit configuration which requires two voltage levels. Thus, there will be two power leads (+, −) identified at 70 and 70" respectively and extending from conductors 56 and 56", and one ground lead 55' from ground conductor 56' for a total of three leads or pins. Encapsulation (not shown) may encase the assembly to provide protection and insulation. As stated, the decoupling capacitor 54 of FIGS. 8A and 8B are preferably used for two voltage devices and need not be any thicker than the single capacitor version (i.e., FIGS. 1-7).

Figure 9:
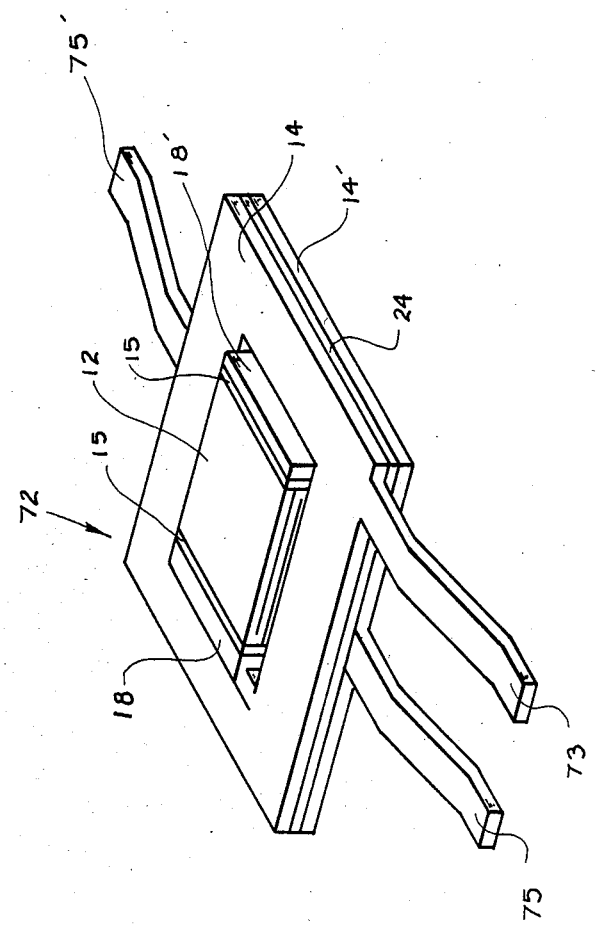
FIG. 9 is a perspective view of yet another embodiment of the decoupling capacitor in accordance with the present invention.

Referring now to FIG. 9, still another embodiment of the present invention, termed a "flat pack" version, is shown at 72. The only significant difference here relative to, for example, the decoupling capacitor of FIGS. 1-3 is the square shape (versus rectangular shape) and the beam lead interconnects 73, 75, 75' (versus pin connectors). Modifications similar to the flat pack capacitor 72 may be made to the other discussed embodiments which would provide compatability with pin grid arrays and other high lead count packaging methods. As the structure of decoupling capacitor 72 is so close to that of capacitor 10, identical reference numerals have been used to identify the similar elements. A pin arrangement as shown in FIG. 9 is commonly used in ECL circuits. This optional pin arrangement includes two ground pins 72 spaced 180° apart from each other and connected to conductor 14' and one voltage pin 73 connected to top conductor 14. It will be understood to those skilled in the art that this two ground pin configuration can be similarly used on any of the other embodiments of the present invention.

Figure 10A:
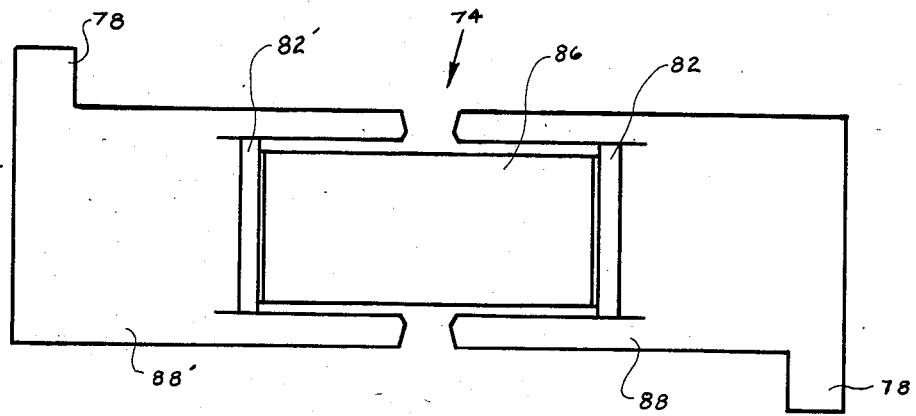
FIG. 10A is a planar view of still another embodiment of the decoupling capacitor, similar to FIG. 1, and in accordance with the present invention.
Figure 10B:
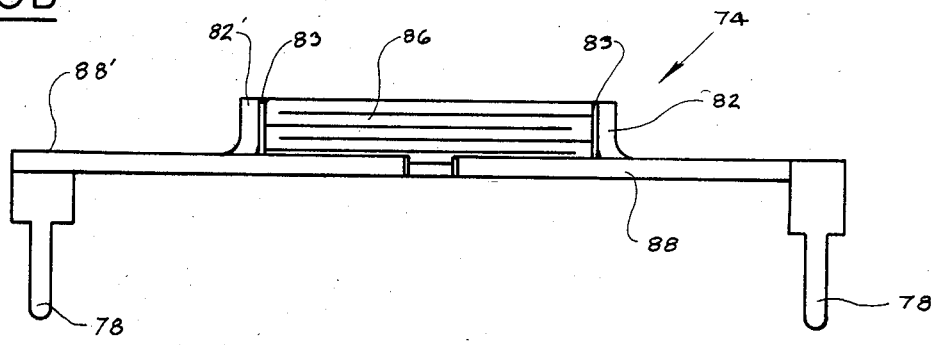
FIG. 10B is a front elevation view of the decoupling capacitor of FIG. 10A.
Figure 13:
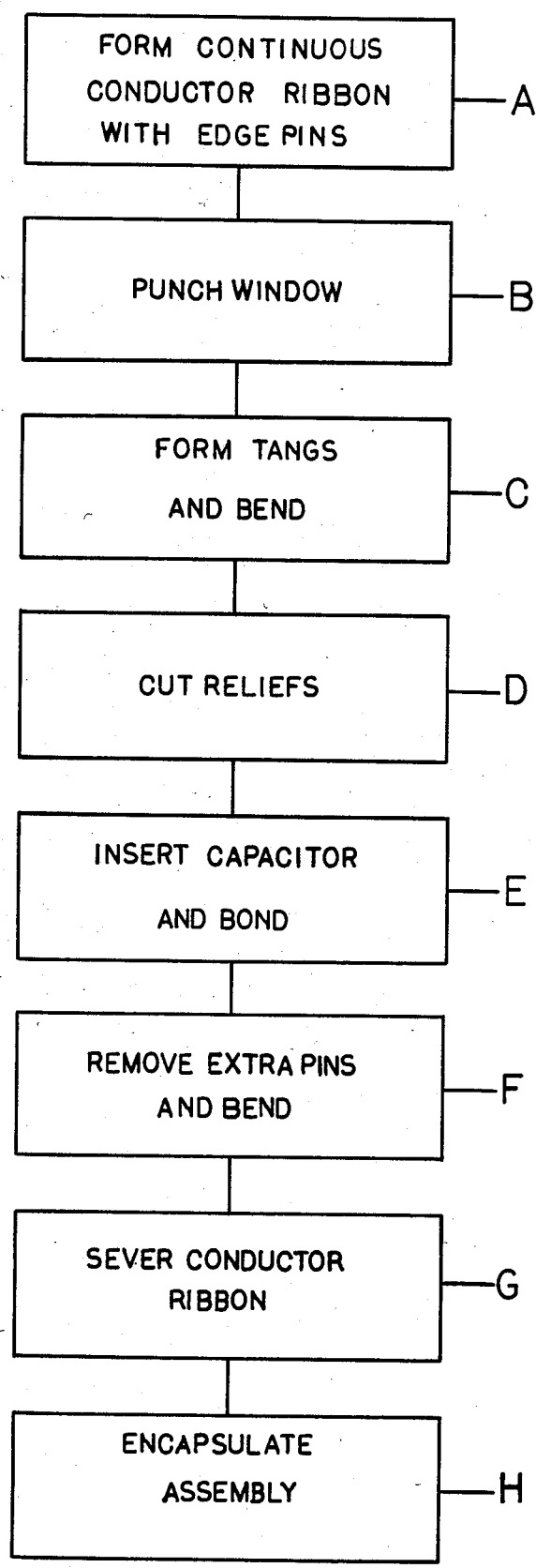
FIG. 13 is a block flow diagram of the manufacturing process in accordance with the embodiments of FIGS. 10A, 10B, 11A, 11B, 12A and 12B.

A simplified and particularly useful embodiment of the decoupling capacitor of the present invention is shown in FIGS. 10A and 10B at 74. Capacitor 74 is extremely well suited for low cost and easy manufacturability. Referring simultaneously to FIGS. 10A-B, 11A-B, 12A-B and 13, the structure and a typical manufacturing sequence for the unit of FIGS. 10A-B is as follows:

Referring first to FIGS. 11A and 11B, a continuous conductor ribbon 76 comprised of a thin, conductive metal is provided with a plurality of pins or tabs 78 formed therein (as by punching, or otherwise) at regular intervals on both longitudinal edges of the ribbon 76 as in Step A in FIG. 13. In Step B, windows 80 are punched through conductor ribbon 76 at an appropriate intervals. Next, two tangs 82,82' are cut from the opposite ends of window 80 and then bent up at a 90 degree angle to the conductor 76 as in Step C (See FIG. 11B). Two reliefs 84 are cut in window 80 half way along the inner edges which are parallel to the conductor 76, as shown in Step D. (Of course, these reliefs 84 could be formed as part of any other step).

Referring now to FIGS. 12A and 12B, a multilayer ceramic chip capacitor 86 is centered over and placed within the window 80 such that the electrodes 83,83' of the chip 86 contact the tangs 82,82' respectively. The chip 86 is then bonded to the tangs 82 by welding, soldering, adhesive, or the like, as in Step E and illustrated by reference numeral 83, to effect mechanical and electrical contact between the tangs and the electrodes. Next, the extraneous pins or tabs 78 are removed as required to configure the decoupling capacitor for a particular integrated circuit or other application. As shown in FIG. 10B and Step F, the pins are then bent at 90 degrees to the plane of the conductor.

Finally, as seen in Step G and FIGS. 10A,10B, the conductor ribbon 78 is severed through the relief cutouts 84 near the middle of the assembly so as to form two electrically independent conductors 88,88'. Each conductor 88 is then sheared to an appropriate length. Thereafter, the entire assembly is encapsulated as in Step H. Note that encapsulation may be accomplished prior to shearing the conductors to length if that proves desirable.

This simplified embodiment of the present invention is shown subsequent to the above identified process step H in FIGS. 10A and 10B and is termed a "single conductor" version. The ease and low cost of manufacturing makes this particular embodiment preferable for certain high volume applications.

It should be understood to those skilled in the art that a multitude of variations including overall dimensioning, number of layers, capacitance and dielectric of the multilayer chip capacitor as well as the number of multilayer chips used will all be encompassed by the capacitor of the present invention. Furthermore, the method of attachment of the chips to the conductors may include welding, soldering or adhesives (both conductive and nonconductive). As described, the number of conductors and their particular composition may be varied as desired while the encapsulation may include molded, cast, dipped or laminated polymer materials. "Dummy pins" (as described in U.S. application Ser. No. 456,650) may also be included for stability in automatic insertion. Also, the dimensions of the assembly and the method of connection to the integrated circuit may vary to make the assembly compatible with a variety of integrated circuit packages.

As hereinabove discussed, the flat decoupling capacitor of the present invention has many improved features and advantages over the prior art. For example, the present invention provides a wider variety of capacitance values and temperature charactertistics than is found in the prior art. In fact, the present invention allows much higher capacitance values than are attainable using conventional planar ceramic capacitors. This is particularly important for high transient current applications such as 256K DRAM.

Another advantage of the present invention is that production costs are far less due to the use of the already commercially available multilayer chip capacitors. It is well known that increasing the capacitance of the multilayer chips does not affect the cost thereof nearly as much as for conventional planar capacitors. Also, automation of capacitor assembly is lower since existing equipment designed to handle chip capacitors may be employed. Further cost reduction is derived from the use of the "single conductor" version of the present invention discussed with respect to FIGS. 10-13.

Other features of the decoupling capacitor of the present invention include reduced EMI/RFI through field containment and reduced antenna area. Also, the reduced inductance of the present invention cuts down the induced voltage spikes when integrated circuits switch.

Furthermore, the present invention achieves efficient use of printed circuit board space because of being mounted under the integrated circuit. Finally, the present invention presents a cost effective, far simplified design of the decoupling loop when compared to prior art capacitors.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A decoupling capacitor which has a plurality of contact pins extending therefrom in spaced relationship, with at least a first pin and a second spaced pin being power supply pins, the capacitor including:
   first conductive plate means having a window therein;
   second conductive plate means having a window therein;
   insulated spacer means between said first and second plate means;
   each of said conductive plate means being provided with connection means extending into the window for connection to a multilayer capacitor, each of said conductive plate means also being provided with contact lead means;
   at least one multilayer chip capacitor, said multilayer chip capacitor being positioned in the window defined in said first and second plate means and being bonded to said connection means of said first and second conductive plate means; and
   insulating means encapsulating said decoupling capacitor.

2. The decoupling capacitor of claim 1 wherein:
   said connection means includes a connecting tab formed in at least one of said plates and extending into the window thereof perpendicular to the plane of said plate.

3. The decoupling capacitor of claim 1 or 2 wherein:
   each said first and second conductive plate means have a planar configuration, said plate means being spatially aligned to form a sandwich; and
   said connection means extending from each of said plate means, said connection means forming a 90 degree angle with said planar conductive plate means.

4. The decoupling capacitor of claim 3 wherein said contact lead means are bent 90 degrees from said planar conductive means.

5. The decoupling capacitor of claim 1 or 2 wherein:
   said first and second conductive plate means corresponds to and is integral with said connection means; and wherein;
   said contact lead means are twisted 90 degrees.

6. The decoupling capacitor of claim 1 or 2 wherein:
   said first and second conductive plate means have a planar configuration, said plate means being spatially aligned;
   said first plate means having a first supporting shelf, said first shelf defining a curved step;
   said second plate means having a second supporting shelf, said second shelf defining a planar extension of said second plate means;
   said connection means extending from said second plate means, said connection means forming a 90 degree angle with said second plate means;
   said multilayer chip capacitor being inserted through said window wherein said chip capacitor is bonded to and supported by said first shelf and said second shelf.

7. The decoupling capacitor of claim 1 or 2 including:
   ground conductive plate means inserted between said first and said second conductive plate means;
   second insulating spacer means between said first plate means and said ground plate means;
   third insulating spacer means between said second plate means and said ground plate means;
   a first multilayer chip capacitor connected between said first plate means and said ground plate means;
   a second multilayer chip capacitor connected between said second plate means and said ground plate means; and
   means for supporting said first and second chip capacitors within said first, second and ground conductive plate means.

8. The decoupling capacitor of claim 7 wherein:
   said first, second and ground conductive plate means have a planar configuration, and said plate means being spatially aligned, said first and said ground plate means having corresponding first clearance windows centrally located therein and formed therethrough, said second and ground plate means having corresponding second clearance windows centrally located therein and formed therethrough.

9. The decoupling capacitor of claim 8 wherein said supporting means includes:

said first plate means having a first supporting shelf, said first shelf defining a curved step;

said ground plate means having a second supporting shelf, said second shelf defining a planar extension of said ground plate means;

said connection means extending from said ground plate means, said connection means forming a 90 degree angle with said ground plate means;

said first multilayer chip capacitor being inserted through said first window wherein said fist chip capacitor is bonded to and supported by said first shelf and said second shelf.

10. The decoupling capacitor chip of claim 8 wherein said supporting means includes:

said ground plate means having a first supporting shelf, said first supporting shelf defining a curved step;

said second plate means having a second supporting shelf, said second supporting shelf defining a planar extension of said second plate means;

said connection means extending from said second plate means, said connection means forming a 90 degree angle with said ground plate means;

said second multilayer chip capacitor being inserted through said second windows wherein said second chip capacitor is bonded to and supported by said first shelf and said second shelf.

11. The capacitor of claim 7 including at least three contact lead means, at least one lead means each being connected to said first, second and ground plate means.

12. The decoupling capacitor of claim 1 or 2 wherein said plate means are rectangular.

13. The decoupling capacitor of claim 1 or 2 wherein said plate means have a square configuration.

14. The decoupling capacitor of claim 1 or 2 wherein said lead means are beam leads.

15. The decoupling capacitor of claim 14 including:
a first beam lead connected to said first conductive plate; and
two second beam leads connected to said second conductive plate, said second beam leads located 180 degrees apart.

16. The decoupling capacitor of claim 1 or 2 wherein said capacitor chip is adhesively bonded.

17. The decoupling capacitor of claim 16 wherein said adhesive is electrically nonconductive.

18. The decoupling capacitor of claim 16 wherein said adhesive is electrically conductive.

19. The decoupling capacitor of claim 1 or 2 wherein:
said first and second conductive plate means are located in the same plane.

20. A method of forming a decoupling capacitor assembly including the steps of:
forming a continuous conductor ribbon with edge pins;
punching a window through the center of said conductor ribbon;
forming two opposing tangs within said window and bending said tangs about 90 degrees;
cutting two reliefs inside said window halfway along the inner edges thereof which run parallel to said conductor ribbon;
inserting a multilayer chip capacitor within said window and bonding said capacitor to said tangs;
removing extraneous edge pins and bending remaining edge pins about 90 degrees;
severing said conductor ribbon at each relief to form two electrically independent conductors; and
encapsulating said assembly.

21. The method of claim 20 including:
severing said conductor ribbon to form independent decoupling capacitors.

22. A decoupling capacitor formed by the method including the steps of:
forming a continuous conductor ribbon with edge pins;
punching a window through the center of said conductor ribbon;
forming two opposing tangs within said window and bending said tangs about 90 degrees;
cutting two reliefs inside said window halfway along the inner edges thereof which run parallel to said conductor ribbon;
inserting a multilayer chip capacitor within said window and bonding said capacitor to said tangs;
removing extraneous edge pins and bending remaining edge pins about 90 degrees;
severing said conductor ribbon at each relief to form two electrically independent conductors; and
encapsulating said assembly.

23. The decoupling capacitor formed by the method of claim 22 including:
severing said conductor ribbon to form independent decoupling capacitors.

* * * * *